US011795053B2

(12) United States Patent
Schaller et al.

(10) Patent No.: US 11,795,053 B2
(45) Date of Patent: Oct. 24, 2023

(54) SENSOR DEVICES WITH GAS-PERMEABLE COVER AND ASSOCIATED PRODUCTION METHODS

(71) Applicant: Infineon Technologies AG, Neubiberg (DE)

(72) Inventors: Rainer Markus Schaller, Saal an der Donau (DE); Klaus Elian, Alteglofsheim (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 66 days.

(21) Appl. No.: 17/217,488

(22) Filed: Mar. 30, 2021

(65) Prior Publication Data

US 2021/0323812 A1    Oct. 21, 2021

(30) Foreign Application Priority Data

Apr. 21, 2020 (DE) .......................... 102020110790.0

(51) Int. Cl.
    *B81B 7/00* (2006.01)
    *B81C 1/00* (2006.01)

(52) U.S. Cl.
    CPC ........ *B81B 7/0051* (2013.01); *B81C 1/00325* (2013.01); *B81B 2203/033* (2013.01); *B81B 2207/07* (2013.01); *B81B 2207/096* (2013.01); *B81C 2203/0118* (2013.01)

(58) Field of Classification Search
    CPC ..................... B81B 7/0051; B81B 2207/095
    See application file for complete search history.

(56) References Cited

U.S. PATENT DOCUMENTS

| 8,912,638 | B2 | 12/2014 | Theuss et al. |
| 9,584,889 | B2 | 2/2017 | Escher-Poeppel et al. |
| 10,870,575 | B2 | 12/2020 | Theuss et al. |
| 2014/0070337 | A1 | 3/2014 | Besling et al. |
| 2014/0217521 | A1* | 8/2014 | Johari-Galle ......... B81B 7/0048 438/51 |
| 2018/0202958 | A1* | 7/2018 | Ali ........................ G01N 27/16 |
| 2019/0033242 | A1* | 1/2019 | Motta .................. G01N 27/123 |
| 2019/0161347 | A1 | 5/2019 | Classen |
| 2020/0152697 | A1* | 5/2020 | Qian ..................... B81B 7/0064 |
| 2020/0255285 | A1 | 8/2020 | Doering et al. |
| 2022/0283123 | A1* | 9/2022 | Bürgi .................. G01N 29/222 |

FOREIGN PATENT DOCUMENTS

| DE | 102006058010 A1 | 6/2008 |
| DE | 102014216223 A1 | 3/2015 |
| DE | 102016216207 A1 | 3/2018 |
| DE | 102017209930 A1 | 12/2018 |
| DE | 102017211451 A1 | 1/2019 |
| DE | 102019117326 A1 | 1/2020 |
| WO | 2013003789 A1 | 1/2013 |

* cited by examiner

Primary Examiner — Moazzam Hossain
(74) Attorney, Agent, or Firm — Harrity & Harrity, LLP

(57) ABSTRACT

A sensor device includes a sensor chip with a microelectromechanical systems (MEMS) structure, wherein the MEMS structure is arranged at a main surface of the sensor chip, and a gas-permeable cover arranged over the main surface of the sensor chip, which covers the MEMS structure and forms a cavity above the MEMS structure.

23 Claims, 5 Drawing Sheets

SENSOR DEVICES WITH GAS-PERMEABLE COVER AND ASSOCIATED PRODUCTION METHODS

RELATED APPLICATION

This application claims priority to German Patent Application No. 102020110790.0, filed on Apr. 21, 2020, which is incorporated herein by reference in its entirety.

FIELD

The present disclosure relates to sensor devices with gas-permeable covers, and associated production methods.

BACKGROUND

Sensor devices can comprise MEMS (micro-electromechanical systems) structures for detecting physical quantities such as pressure, acceleration, light, gas, etc. Measurement results provided by the sensor devices can be distorted in a variety of ways, for example by dirt particles on the sensitive MEMS structures or by thermo-mechanical stresses between the components of the sensor device. Manufacturers of sensor devices are constantly striving to improve their products. In particular, it may be desirable to develop sensor devices that can overcome the above problems and deliver improved measurement results. It may also be desirable to provide methods for producing such sensor devices.

SUMMARY

Various aspects relate to a sensor device. The sensor device includes a sensor chip having a MEMS structure, wherein the MEMS structure is arranged at a main surface of the sensor chip. The sensor device further includes a gas-permeable cover arranged over the main surface of the sensor chip, which covers the MEMS structure and forms a cavity above the MEMS structure.

Various aspects relate to a method for producing sensor devices. The method includes generating a semiconductor wafer having a plurality of sensor chips, wherein each sensor chip includes a MEMS structure arranged at a main surface of the semiconductor wafer. The method also includes forming a plurality of gas-permeable covers over the main surface of the semiconductor wafer, wherein each gas-permeable cover covers one of the MEMS structures and forms a cavity above the MEMS structure. The method also includes singulating the semiconductor wafer into a plurality of sensor devices.

BRIEF DESCRIPTION OF THE DRAWINGS

Devices and methods according to the disclosure are described in more detail in the following with the aid of drawings. The elements shown in the drawings are not necessarily reproduced true to scale relative to each other. Identical reference signs can refer to identical components.

DETAILED DESCRIPTION

The figures described below show sensor devices and methods for producing sensor devices according to the disclosure. In these, the methods and devices described may be shown in a general form, in order to describe aspects of the disclosure in qualitative terms. The methods and devices described may have other aspects which for the sake of simplicity cannot be shown in the respective figure. However, each example may be extended by one or more aspects that are described in conjunction with other examples according to the disclosure. Thus, statements relating to a particular figure can apply equally to examples of other figures.

Figure 1A:
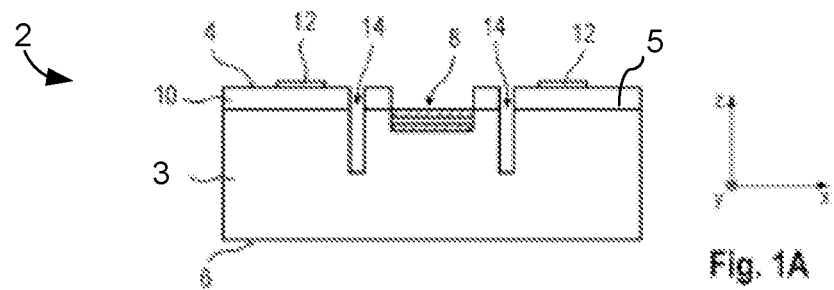
FIGS. 1A to 1F schematically show a method for producing a sensor device 100 according to one or more embodiments.

In the cross-sectional side view of FIG. 1A, a sensor chip 2, including a semiconductor material 3, may have an upper main surface 4 and a lower main surface 6 opposite thereto can be provided. The semiconductor material 3 may be formed as a semiconductor layer that has a main surface 5. One or more MEMS structures 8 can be arranged at the main surface 5. In addition, a passivation layer 10 and electrical contacts 12 of the sensor chip 2 can be arranged at the main surface 5. Thus, a lower surface of the passivation layer 10 may be arranged at the main surface 5 and an upper surface of the passivation layer 10 may form the upper main surface 4 of the sensor chip 2. The passivation layer 10 may have an opening 11 that is formed over the MEMS structure 8 to expose the MEMS structure 8. The MEMS structure 8 can be surrounded by one or more trenches 14 that extend from the main surface 5 into the semiconductor material 3. In some implementations, the trenches 14 may extend from the upper main surface 4 into the semiconductor material 3, if the passivation layer 10 is provided.

The sensor chip 2 can be a semiconductor chip, which can be fabricated from silicon, for example. For example, the semiconductor material 3 may be silicon. The MEMS structure 8 can be integrated into the sensor chip 2 and can also be referred to as a MEMS cell. In particular, the MEMS structure 8 can be integrated into the semiconductor material 3 such that the MEMS structure 8 resides within the semiconductor material 3 of the sensor chip 2. The MEMS structure 8 can be fully integrated into the semiconductor material 3 such that the MEMS structure 8 may reside fully within the semiconductor material 3 of the sensor chip 2. The MEMS structure 8 may extend from the main surface 5 into the semiconductor material 3. FIG. 1A shows an example of the MEMS structure 8 in the form of a membrane. More generally, the MEMS structure 8 may comprise one or more of the following: bridges, membranes, beams, cantilevers, tongue structures, comb structures, etc. The sensor chip 2 can be designed to detect one or more physical variables, such as pressure, acceleration, temperature, humidity, etc. Examples of sensors include pressure sensors, tire pressure sensors, acceleration sensors, gas sensors, humidity sensors, etc.

The passivation layer 10 can be designed to protect the parts of the sensor chip 2 arranged underneath it from external influences. For example, the passivation layer 10 can be made of one or more of a glass material, an imide, or a polyimide. The passivation layer 10 may or may not be considered as part of the sensor chip 2. The electrical contacts 12 can be electrically coupled with internal electronic structures of the sensor chip 2 and provide electrical contacting of the electronic structures. For the sake of simplicity, FIG. 1A does not show an electrical connection between the electrical contacts 12 and the electronic structures of the sensor chip 2. In the example illustration of FIG. 1A, the electrical contacts 12 can be arranged on the passivation layer 10. In other examples, the electrical contacts 12 can be at least partially embedded in the passivation layer 10.

The trenches 14 can each extend from the upper main surface 4 of the sensor chip 2 into the semiconductor material 3 of the sensor chip 2. A width of the trenches 14 in the x-direction and/or in the y-direction can be in a range from approximately 5 microns to approximately 20 microns. A depth of the trenches 14 in the z-direction can lie in a range from approximately 80 microns to approximately 120 microns. Viewed in the z-direction, the trenches 14 can at least partially surround the MEMS structure 8 within the semiconductor material 3. The individual trenches 14 can each be formed in an L-shape, viewed in the z-direction. The L-shapes of the trenches 14 can be interleaved and form a nested overall structure that can surround the MEMS structure 8. In particular, in this case the individual L-shapes cannot contact each other, i.e., in particular, the interleaved overall structure cannot form a closed curve.

During manufacture or the subsequent operation of the sensor device to be produced, thermo-mechanical stresses may occur between components of the device. For example, such stresses can occur during a temperature cycling process (thermal cycling). The thermo-mechanical stresses and/or resulting warping can be absorbed by the trenches 14, so that the stress-sensitive MEMS structure 8 is substantially decoupled from the mechanical stresses. Distortion of measurement results due to thermo-mechanical stresses can therefore be prevented, or at least reduced, by the trenches 14.

Figure 1B:
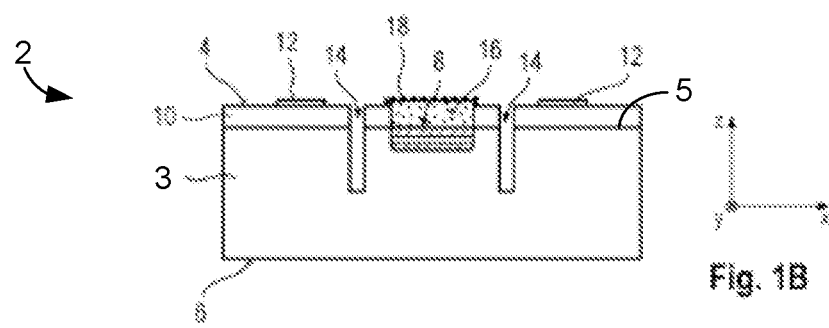

In the cross-sectional side view of FIG. 1B, a sacrificial layer 16 can be arranged or deposited over the MEMS structure 8. For example, the sacrificial layer 16 can be manufactured from at least one of photoresist, PMGI (polymethylglutarimide), etc. A thickness of the sacrificial layer 16 in the z-direction can lie in a range from approximately 0.5 microns to approximately 50 microns. A material layer 18 can be arranged or deposited on the sacrificial layer 16. In general, the material layer 18 can be manufactured from a material that can be structured. More precisely, the material layer 18 can be manufactured from a photostructurable material, in particular one that can be structured based on a photolithographic process. For example, the material layer 18 can be manufactured from at least one of photoresist, polyimide, PBO (polybenzoxazole), etc. The material layer 18 can initially be deposited homogeneously over the sacrificial layer 16, mechanically contacting the sacrificial layer 16 and the passivation layer 10. The deposited material layer 18 can then be structured using a suitable process, in particular using a photolithographic process.

Figure 1C:
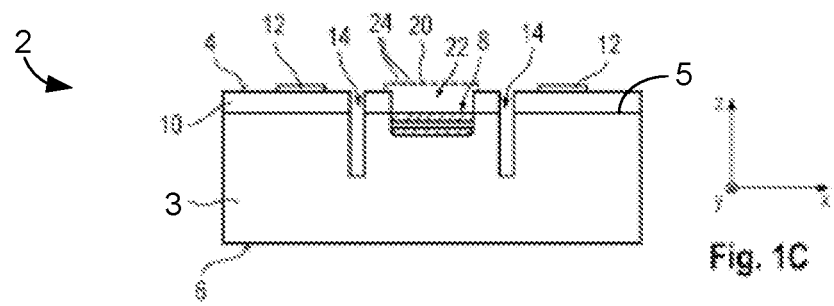
Figure 5:
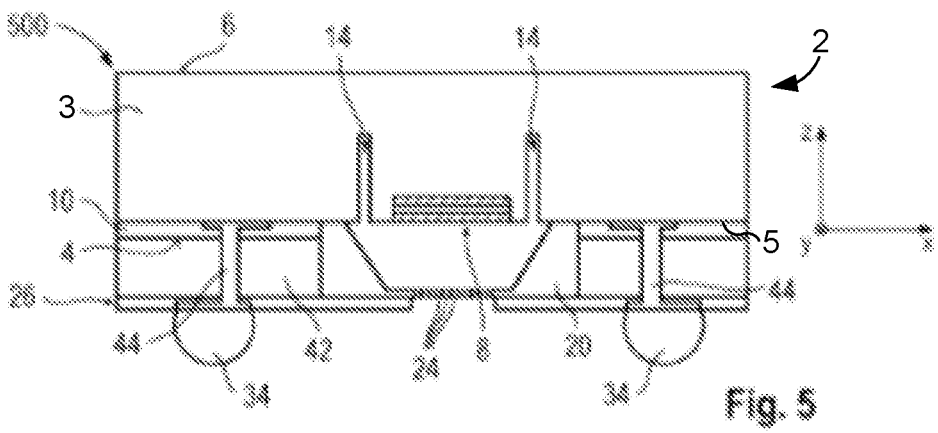
FIG. 5 shows a cross-sectional side view of a sensor device 500 according to one or more embodiments.
Figure 7:
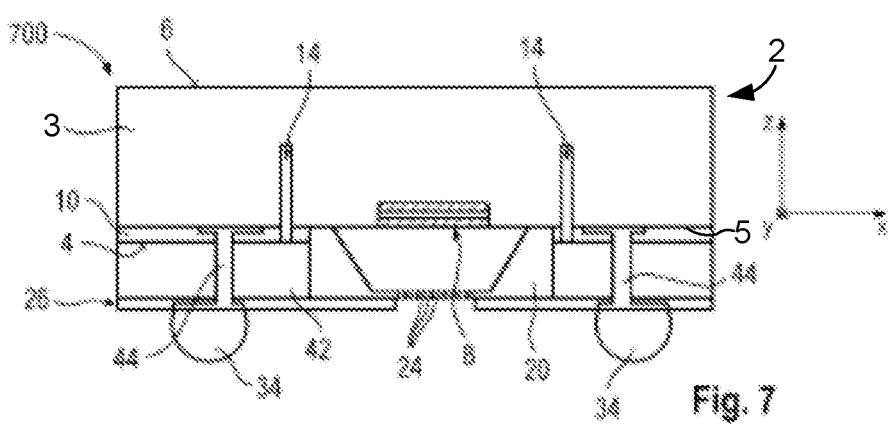
FIG. 7 shows a cross-sectional side view of a sensor device 700 according to one or more embodiments.

In the cross-sectional side view of FIG. 1C, the sacrificial layer 16 can be removed, for example using at least one of a wet chemical process, a wet chemical washing process, an incineration process, etc. After the removal of the sacrificial layer 16, the structured material layer 18 can form a gas-permeable cover 20 arranged over the upper main surface 4 of the sensor chip 2. The gas-permeable cover 20 may be formed on (e.g., directly on) the upper main surface 4 of the of the sensor chip 2, as shown in FIG. 1C, or may be formed on (e.g., directly on) the main surface 5 of the semiconductor material 3, as shown in FIGS. 5 and 7. The term "cover" can be optionally replaced by one of the terms "membrane" and "diaphragm". The gas-permeable cover 20 can cover the MEMS structure 8 and form a cavity 22 above the MEMS structure 8. The opening 11 may form at least part of the cavity 22. In other words, the gas-permeable cover 20 may be arranged over the opening 11 to cover the MEMS structure 8 and form the cavity 22 above the MEMS structure 8. In the example of FIG. 1C, viewed in the z-direction the trenches 14 can be arranged outside of an outline of the gas-permeable cover 20. According to the above, the lid 20 can be manufactured from at least one of a photoresist, a polyimide, a polybenzoxazole, etc.

As a result of the above-described structuring of the material layer 18 in FIG. 1B, the gas-permeable cover 20 can comprise a plurality of openings 24. A maximum dimension of the individual openings 24 can be less than approximately 5 microns in each case. In an example, a minimum dimension can be approximately 0.1 microns. The gas-permeable cover 20 can cover the MEMS structure 8, thereby preventing particles from reaching the MEMS structure 8 and contaminating it. Due to the given dimensions of the openings 24, it is possible in particular to prevent particles with a diameter of more than 5 microns from contaminating the MEMS structure 8. The risk of contamination by extraneous particles can exist both during the manufacture of the sensor device to be produced and during a subsequent operation of the finished sensor device. By using the cover 20, any distortion of measurement results can be prevented or at least reduced.

Due to the openings 24 formed in the cover 20, the cover 20 can be gas-permeable, in particular air-permeable. For example, if the sensor device to be produced is a pressure sensor, the openings 24 can enable the MEMS structure 8 to detect pressures or pressure changes in a gas surrounding the device. Consequently, this can be referred to as a pressure-permeable cover 20.

Figure 1D:
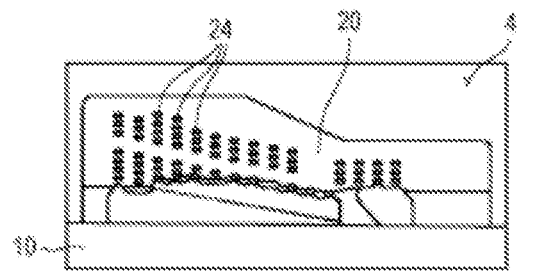

The perspective cross-sectional side view of FIG. 1D shows an exemplary structure of the gas-permeable cover 20 in more detail. In particular, a part of the arrangement of FIG. 1C located between the trenches 14 is shown. In the example of FIG. 1D, the cover 20 can have several dozen openings 24, which can each be designed essentially circular. In other examples, the number and shape of the openings 24 can be chosen differently.

Figure 1E:
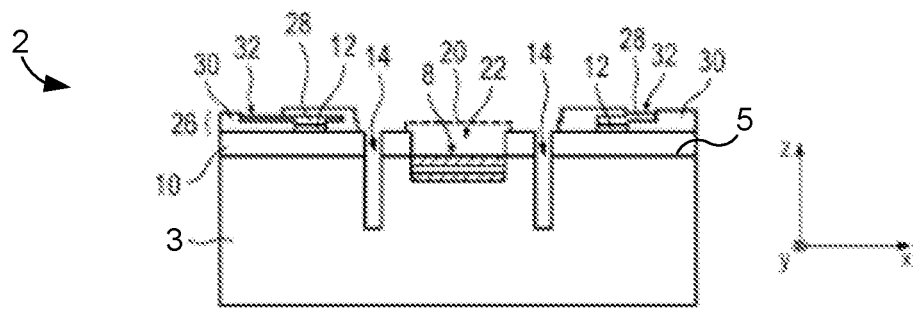

In the cross-sectional side view of FIG. 1E an electrical rewiring layer (or redistribution layer) 26 can be formed over the top of the sensor chip 2. The rewiring layer 26 can contain one or more conductor tracks 28 in the form of metal layers or metal tracks, which can extend essentially parallel to the top of the sensor chip 2. The conductor tracks 28 can be made of copper or a copper alloy, for example. One or more dielectric layers 30 can be arranged between the conductor tracks 28 in order to electrically insulate the conductor tracks 28 from one another. The dielectric layers 30 can be manufactured from an oxide and/or a nitride, for example. Metal layers or conductor tracks 28 arranged on different x-y planes can be electrically interconnected by means of a plurality of vias, for example. The conductor tracks 28 of the rewiring layer 26 can perform a redistribution or rewiring function to make the electrical contacts 12 of the sensor chip 2 available at other positions on the top of the arrangement. Exposed sections of the conductor tracks 28 can form one or more electrical contact pads 32, which can be electrically connected to the electrical contacts 12 of the sensor chip 2.

Figure 1F:
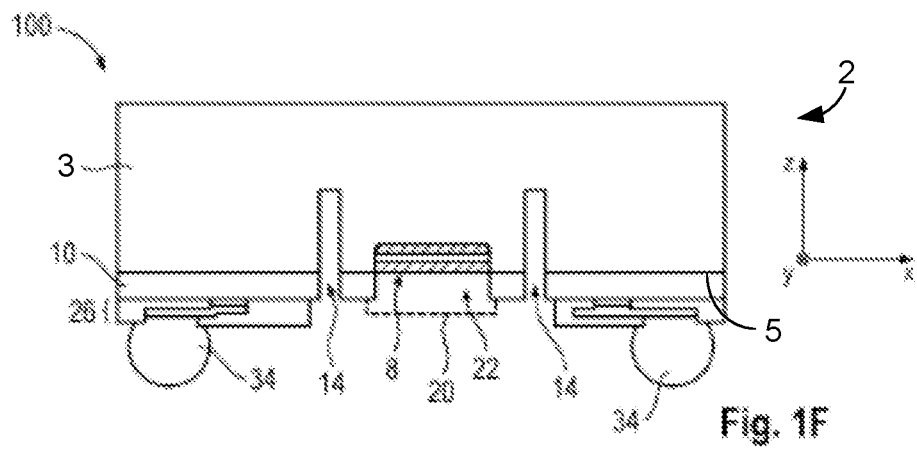

In the cross-sectional side view of FIG. 1F, the arrangement of FIG. 1E can be inverted. In addition, peripheral connecting elements 34 can be arranged on the electrical contact pads 32 and electrically coupled with them. In the example of FIG. 1F, the peripheral connecting elements 34 can be designed in the form of solder deposits (or solder elements or solder balls). The peripheral connecting elements 34 can be designed to couple the sensor device 100 electrically and mechanically with a circuit board (not shown). For example, the sensor device 100 can be mounted on the circuit board by means of a soldering operation via the peripheral connecting elements 34.

When viewed in the z-direction, an outline of the sensor chip 2 can be essentially identical to an outline of the sensor device 100. This allows a small or minimal form factor of the sensor device 100 to be implemented. The sensor device 100 can be referred to as a chip-scale device, a chip-size device, a chip-scale package (CSP) or chip-size package. In particular, the sensor device 100 can be a BGA (Ball Grid Array) device, a BGA package, an LGA (Land Grid Array) device or an LGA package.

In the exemplary method illustrated in FIGS. 1A to 1F, for the sake of simplicity, the production of only one sensor device 100 is shown and described. In fact, the method of FIGS. 1A to 1F can be performed at the wafer level or in the form of a batch process. One or more of the described method steps can be carried out at wafer level. The sensor device 100 can therefore also be referred to as a wafer-level device or wafer-level package. For example, in a method at the wafer level, a semiconductor wafer with a plurality of sensor chips 2 can be processed in parallel, a plurality of MEMS structures 8 can be formed in parallel over the respective sensor chip 2, a plurality of gas-permeable covers 20 can be manufactured over the respective MEMS structure 8, etc. After the method steps of FIGS. 1A to 1F, the semiconductor wafer can be divided into a plurality of sensor devices 100 by a singulation process. In this context, for example, a mechanical dicing process and/or a stealth dicing process can be used. It should be noted that all other methods according to the disclosure described herein can also be carried out at least partially at wafer level.

Figure 2:
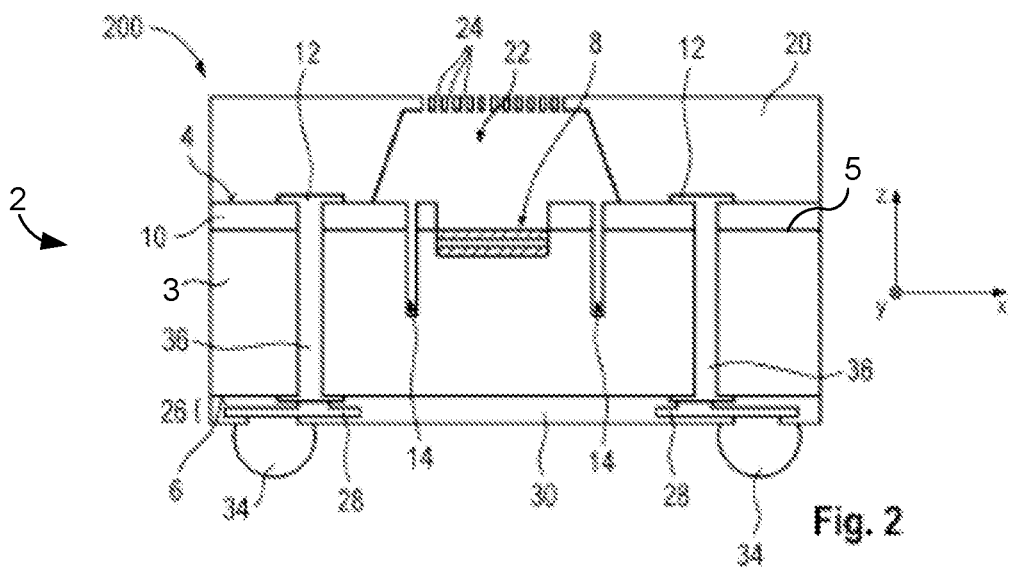
FIG. 2 shows a cross-sectional side view of a sensor device 200 according to one or more embodiments.

The sensor device 200 of FIG. 2 can be at least partially similar to the sensor device 100 of FIG. 1 and comprise similar components. In contrast to FIGS. 1A to 1, the gas-permeable cover 20 in FIG. 2 can be designed differently. The cover 20 here can be manufactured from at least one of a semiconductor material, a glass material or a ceramic material. The cover 20 can be an electrically passive structure and does not need to fulfill any electrical function. In the example of FIG. 2, the cover 20 can comprise an essentially identical dimension in the x-direction and/or in the y-direction as the sensor chip 2. Viewed in the z-direction, the trenches 14 can be arranged inside an outline of the gas-permeable cover 20.

In a similar way to the method of FIGS. 1A to 1, the sensor device 200 can in particular be manufactured at wafer level. This involves providing a semiconductor wafer, which can comprise a plurality of sensor chips 2 with MEMS structures 8. In addition, a wafer having a plurality of recesses can be provided, which can be manufactured from at least one of semiconductor material, a glass material, or a ceramic material. In specific examples, this wafer can be a silicon wafer or a glass wafer. The wafer with the recesses can be bonded to the MEMS semiconductor wafer that includes the semiconductor material 3, the recesses being arranged above the MEMS structures 8 and the cavities 22 being formed. The openings 24 can be formed in the bottom surfaces of the recesses. For example, the recesses and the openings 24 can be produced by an etching process. The arrangement of the bonded wafers can finally be separated into a plurality of sensor devices 200 in a singulation process.

The connections between the sensor chip 2 and the cover 20 can thus be provided in the form of wafer bonds. Depending on the material of the sensor chip 2 and the cover 20, different wafer bonding techniques can be used for this. One example may involve a wafer bonding process without the use of an intermediate layer. In particular, this can be a direct bonding or an anode bonding process. Another example may involve a wafer bonding process that uses an intermediate layer. This can be, in particular, glass-frit bonding, soldering, eutectic bonding, thermo-compression bonding, or adhesive bonding. For example, the wafer bonds between the sensor chip 2 and the cover 20 can correspond to a silicon-silicon connection or a silicon-glass connection. In this context, it should be noted that for clarity of presentation the wafer bonds described above are not shown in FIG. 2, rather a representation was chosen in which the passivation layer 10 is arranged between the semiconductor material 3 of the sensor chip 2 and the cover 20.

In contrast to FIGS. 1A to 1E, in FIG. 2 a rewiring layer 26 can be formed over a main surface 6 of the sensor chip 2 which is located opposite the main surface 4 with the MEMS structure 8. The sensor device 200 can comprise one or more electrical vias 36 passing from the upper main surface 4 through the sensor chip 2 to the lower main surface 6, which can electrically couple the electrical contacts 12 of the sensor chip 2 to the rewiring layer 26. In particular, the electrical via connections 36 can be TSVs (through silicon vias).

Figure 3:
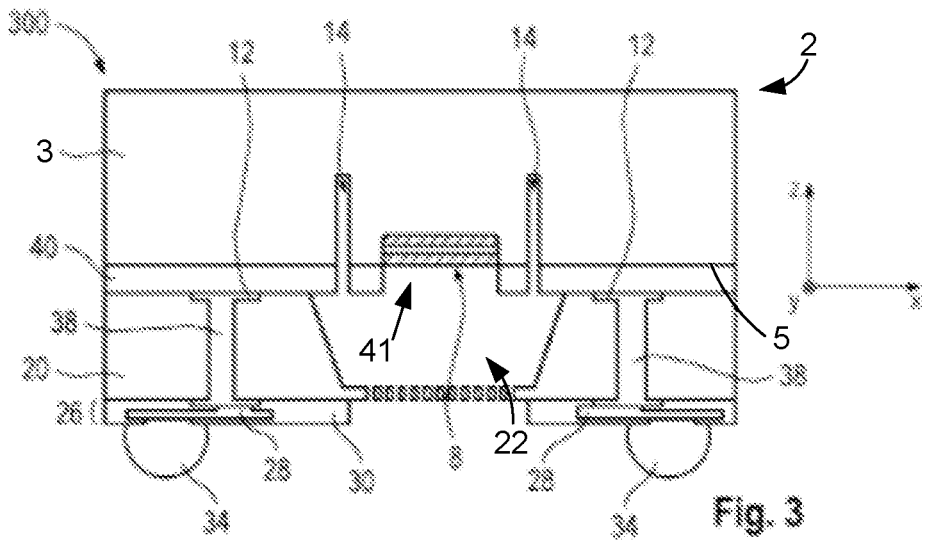
FIG. 3 shows a cross-sectional side view of a sensor device 300 according to one or more embodiments.

The sensor device 300 of FIG. 3 can comprise, at least in part, similar components to the sensor devices described earlier. In contrast to FIG. 2, in FIG. 3 a rewiring layer 26 can be arranged over a main surface of the gas-permeable cover 20 facing away from the sensor chip 2. The sensor device 300 can comprise one or more electrical vias 38 passing from the top of the cover 20 to the underside of the cover 20, which electrically couple the electrical contacts 12 of the sensor chip 2 to the rewiring layer 26. If the cover 20 is made of silicon, the electrical via connections 38 can be TSVs (through silicon vias).

The sensor device 300 can comprise an elastic layer 40 arranged between the sensor chip 2 and the gas-permeable cover 20. The elasticity of the elastic layer 40 can be greater than the elasticity of the sensor chip 2. The elastic layer 40 can therefore be designed to absorb thermo-mechanical stresses that can occur between the sensor chip 2 and the cover 20, for example. In one example, the elastic layer 40 can be made from a nitride. The elastic layer 40 can be provided, in particular, if the trenches 14 are not sufficiently effective in decoupling the MEMS structure 8 from thermo-mechanical stresses. In an example, the sensor chip 2 and the gas-permeable cover 20 can mechanically contact the elastic layer 40. The elastic layer 40 may have an opening 41 that is formed over the MEMS structure 8 to expose the MEMS structure 8. The opening 41 may form at least part of the cavity 22. In other words, the gas-permeable cover 20 may be arranged over the opening 41 to cover the MEMS structure 8 and form the cavity 22 above the MEMS structure 8. The passivation layer 10 described in the preceding examples may also be present, but for the sake of simplicity it is not shown in FIG. 3. For example, the passivation layer 10 can be arranged between the semiconductor material 3 of the sensor chip 2 and the elastic layer 40.

Figure 4:
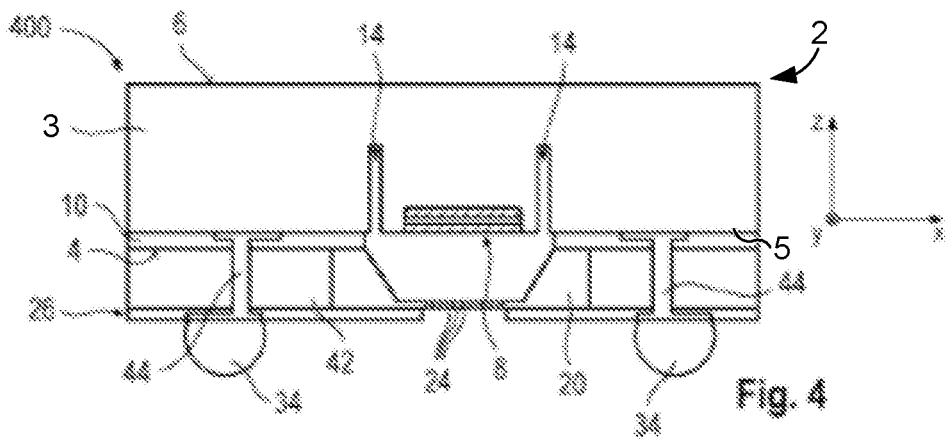
FIG. 4 shows a cross-sectional side view of a sensor device 400 according to one or more embodiments.

The sensor device 400 of FIG. 4 can comprise, at least in part, similar components to the sensor devices described earlier. In addition, the sensor device 400 can comprise an encapsulation material 42 arranged over the main surface 4 of the sensor chip 2. The gas-permeable cover 20 can be at least partially embedded in the encapsulation material 42, wherein the openings 24 in the cover 20 can remain uncovered by the encapsulation material 42 so that the cover 20 is still gas-permeable. In the example of FIG. 4, the encapsulation material 42 can cover the side surfaces of the cover 20 and the lower surface of the cover 20 can be uncovered by the encapsulation material 42. In comparison to previous examples, the cover 20 in FIG. 4 can have smaller dimensions.

The encapsulation material 42 can be manufactured using a molding process. In particular, the encapsulation material 42 may be produced using one or more of the following techniques: compression molding, injection molding, powder molding, liquid molding, etc. In particular, these techniques can be carried out at the wafer level during the production of the sensor device 400. For example, a molding compound forming the encapsulation material 42 may comprise at least one of an epoxy, a filled epoxy, a glass fiber-filled epoxy, an imide, a thermoplastic, a thermosetting polymer, or a polymer mixture.

The sensor device 400 can comprise a rewiring layer 26 arranged over the lower main surface of the encapsulation material 42. In the example of FIG. 4, the lower surface of the cover 20 may be partially covered by the rewiring layer 26. The sensor device 400 may have one or more electrical vias 44 running from the top of the encapsulation material 42 through the encapsulation material 42 to the underside of the encapsulation material 42. For example, the electrical vias 44 can be made from "copper pillar bumps" or "stud bumps", which can be produced by an electro-galvanic process, for example. In an example, the electrical vias 44 can be encapsulated by the encapsulation material 42 in the molding process and then exposed again after the encapsulation material 42 has been ground off the underside. The rewiring layer 26 can be electrically coupled to electrical contacts 12 of the sensor chip 2 via the electrical vias 44. Internal electronic structures of the sensor chip 2 can thus be electrically contacted by additional peripheral connecting elements 34.

In the example of FIG. 4 the gas-permeable cover 20 can be mechanically connected to the passivation layer 10. In this context, the passivation layer 10 can be, in particular, a polyimide layer. The mechanical connection can be provided in any desired way, for example by means of an adhesive. In the example of FIG. 4, viewed in the z-direction the trenches 14 can be arranged inside an outline of the gas-permeable cover 20.

Figure 6:
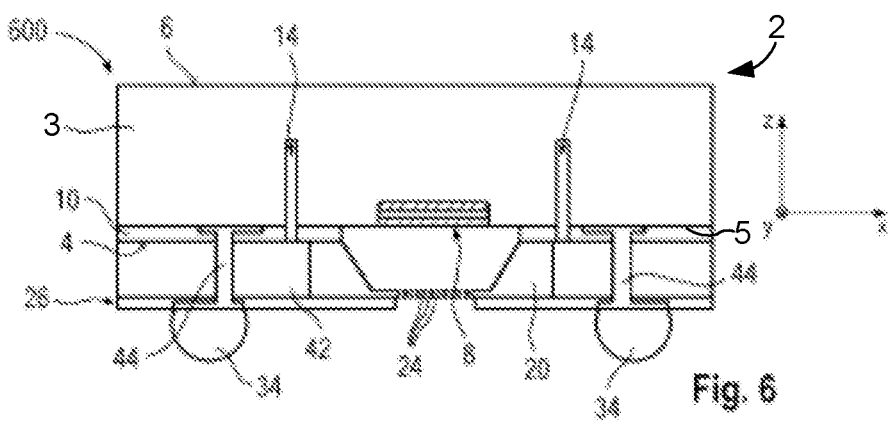
FIG. 6 shows a cross-sectional side view of a sensor device 600 according to one or more embodiments.

The sensor device 500 of FIG. 5 can be at least partially similar to the sensor device 400 of FIG. 4. In contrast to FIG. 4, the gas-permeable cover 20 here can be mechanically connected to a semiconductor material 3 of the sensor chip 2. The cover 20 and the sensor chip 2 can thus be connected to each other, for example via a silicon-silicon connection. The sensor device 600 of FIG. 6 can be at least partially similar to the sensor device 400 of FIG. 4. In contrast to FIG. 4, viewed in the z-direction the trenches 14 in the example of FIG. 6 can be arranged outside an outline of the gas-permeable cover 20.

The sensor device 700 of FIG. 7 can be at least partially similar to the sensor device 500 of FIG. 5. In contrast to FIG. 5, viewed in the z-direction the trenches 14 in the example of FIG. 7 can be arranged outside an outline of the gas-permeable cover 20.

Figure 8A:
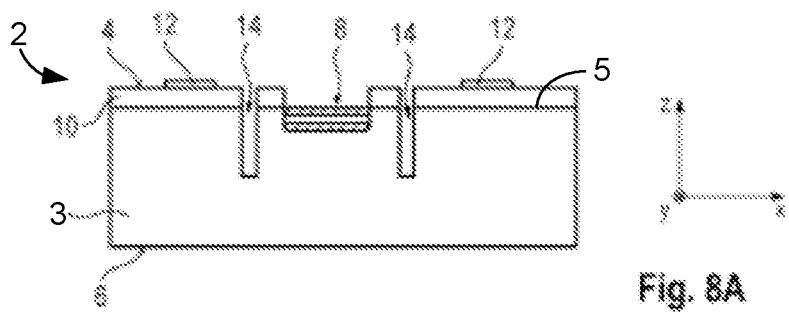
FIGS. 8A to 8E schematically show a method for producing a sensor device 800 according to one or more embodiments.

In the cross-sectional side view of FIG. 8A, a sensor chip 2 having one or more MEMS structures 8 can be provided. The method step of FIG. 8A can be similar to the method step of FIG. 1A.

Figure 8B:
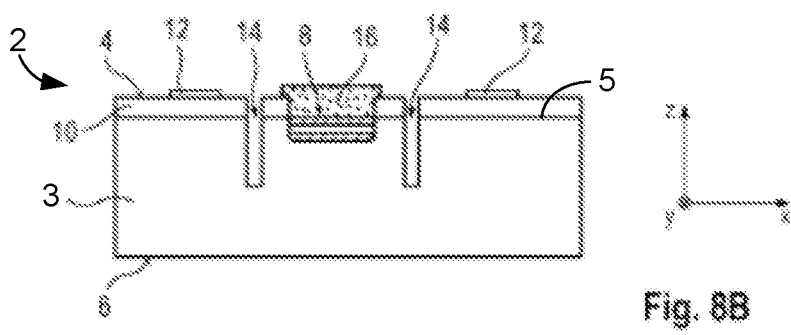

The method step shown in the cross-sectional side view of FIG. 8B can be at least partially similar to the method step of FIG. 1B. A sacrificial layer 16 can be arranged or deposited over the MEMS structure 8. For example, the sacrificial layer 16 can be manufactured from at least one of photoresist, PMGI, etc. The sacrificial layer 16 can cover the MEMS structure 8 and parts of the passivation layer 10.

Figure 8C:
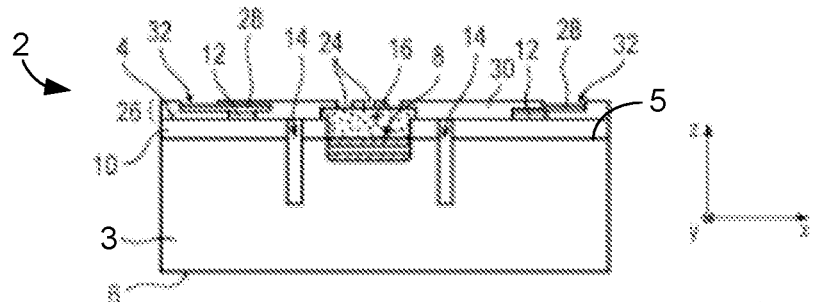

In the cross-sectional side view of FIG. 8C, a rewiring layer 26 can be formed over the top of the semiconductor chip 2 and the sacrificial layer 16. The rewiring layer 26 can be similar to the rewiring layers of previous examples. In the example of FIG. 8C, the dielectric material 30 of the rewiring layer 26 can be deposited over the sacrificial layer 16 and structured. In structuring the dielectric material 30, a plurality of openings 24 can be formed.

Figure 8D:
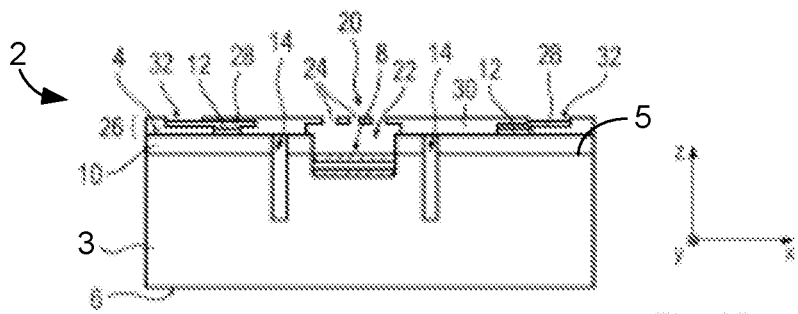

The method step shown in the cross-sectional side view of FIG. 8D can be at least partially similar to the method step of FIG. 1C. In this step the sacrificial layer 16 can be removed, for example using at least one of a wet chemical process, a wet chemical washing process, an incineration process, etc. After the removal of the sacrificial layer 16, part of the rewiring layer 26 can form a gas-permeable cover 20 arranged over the top of the sensor chip 2. In particular, the cover 20 can be produced using the dielectric material 30 of the rewiring layer 26. The cover 20 can cover the MEMS structure 8 and form a cavity 22 above the MEMS structure 8. Due to the above-described structuring of the dielectric material 30 of the rewiring layer 26, the gas-permeable cover 20 can have a plurality of openings 24. The openings 24 can provide (fluidic) gas connections between the MEMS structure 8 and the environment of the sensor device. The cover 20 of FIG. 8D can have a similar structure to covers described above. In the example of FIG. 8D, viewed in the z-direction the trenches 14 can be arranged outside of an outline of the gas-permeable cover 20.

Figure 8E:
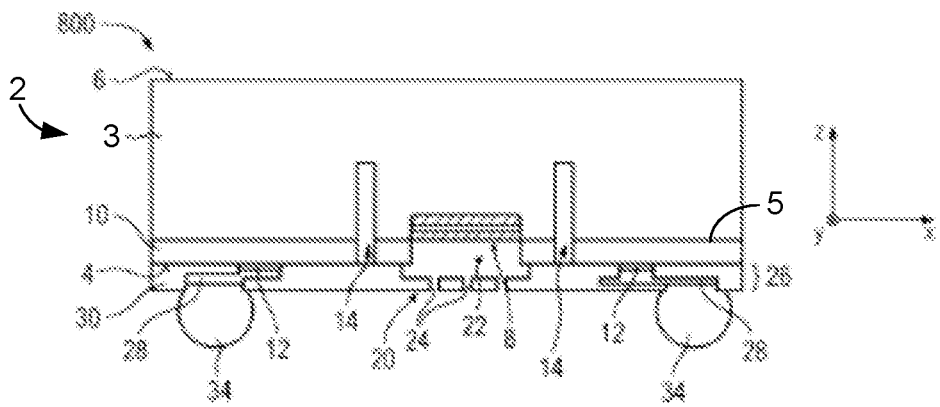

The method step shown in the cross-sectional side view of FIG. 8E can be at least partially similar to the method step of FIG. 1F.

Figure 9:
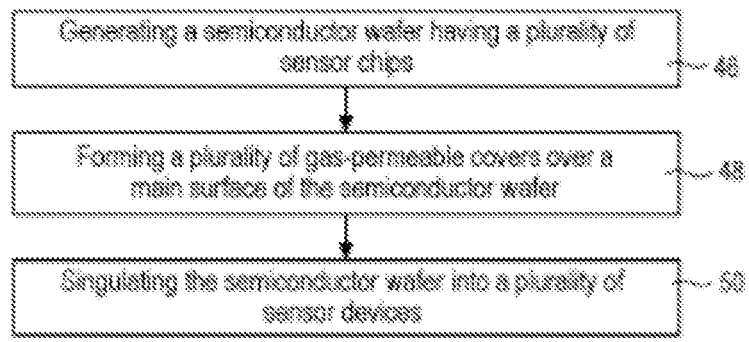
FIG. 9 shows a flowchart of a method for producing a sensor device according to one or more embodiments.

The method of FIG. 9 is presented in a general form in order to describe essential aspects of a method according to the disclosure in qualitative terms. The method can have further aspects, which for the sake of simplicity are not shown or described in FIG. 9. The methods of FIGS. 1 and 8 can be considered as more detailed implementations of the method of FIG. 1.

At 46, a semiconductor wafer having a plurality of sensor chips can be generated, each sensor chip having a MEMS structure arranged at a main surface of the semiconductor wafer. At 48, a plurality of gas-permeable covers can be formed over the main surface of the semiconductor wafer, wherein each gas-permeable cover covers one of the MEMS structures and forms a cavity above the MEMS structure. At 50, the semiconductor wafer can be singulated into a plurality of sensor devices.

Examples

In the following, sensor devices and methods for producing sensor devices will be explained using examples.

Example 1 is a sensor device comprising: a sensor chip with a MEMS structure, the MEMS structure being arranged at a main surface of the sensor chip; and a gas-permeable cover arranged over the main surface of the sensor chip, which covers the MEMS structure and forms a cavity above the MEMS structure.

Example 2 is a sensor device according to example 1, wherein the gas-permeable cover has a plurality of openings and a maximum dimension of each opening is less than 5 microns.

Example 3 is a sensor device according to example 1 or 2, wherein the gas-permeable cover is manufactured from at least one of a photoresist, a polyimide or a polybenzoxazole.

Example 4 is a sensor device according to example 1 or 2, wherein the gas-permeable cover is manufactured from at least one of a semiconductor material, a glass material or a ceramic material.

Example 5 is a sensor device according to one of the preceding examples, wherein in a plan view of the main surface of the sensor chip an outline of the sensor chip is essentially identical to an outline of the sensor device.

Example 6 is a sensor device according to one of the preceding examples, further comprising: a plurality of trenches, each extending from the main surface of the sensor chip into a semiconductor material of the sensor chip and surrounding the MEMS structure in a plan view of the main surface of the sensor chip.

Example 7 is a sensor device according to example 6, wherein in a plan view of the main surface of the sensor chip the trenches are arranged outside of an outline of the gas-permeable cover.

Example 8 is a sensor device according to example 6, wherein in a plan view of the main surface of the sensor chip the trenches are arranged inside an outline of the gas-permeable cover.

Example 9 is a sensor device according to one of the preceding examples, further comprising: a rewiring layer which electrically couples electrical contacts of the sensor chip with peripheral connecting elements of the sensor device, wherein the rewiring layer is arranged over the main surface of the sensor chip, over a main surface of the sensor chip opposite to the main surface of the sensor chip, or over a main surface of the cover.

Example 10 is a sensor device according to example 9, wherein the gas-permeable cover is manufactured from a part of the rewiring layer.

Example 11 is a sensor device according to one of the preceding examples, further comprising: an electrical via passing through the sensor chip, which electrically couples electrical contacts of the sensor chip with peripheral connecting elements of the sensor device.

Example 12 is a sensor device according to one of the preceding examples, further comprising: an electrical via passing through the gas-permeable cover, which electrically couples electrical contacts of the sensor chip with peripheral connecting elements of the sensor device.

Example 13 is a sensor device according to one of the preceding examples, further comprising: an encapsulation material arranged over the main surface of the sensor chip, the gas-permeable cover being at least partially embedded in the encapsulation material.

Example 14 is a sensor device according to example 13, further comprising: an electrical via passing through the encapsulation material, which electrically couples electrical contacts of the sensor chip with peripheral connecting elements of the sensor device.

Example 15 is a sensor device according to one of the preceding examples, wherein the gas-permeable cover is mechanically connected to a semiconductor material of the sensor chip.

Example 16 is a sensor device according to one of the examples 1 to 14, wherein the gas-permeable cover is mechanically connected to a polyimide layer arranged over the main surface of the sensor chip.

Example 17 is a sensor device according to one of the preceding examples, further comprising: an elastic layer arranged between the sensor chip and the gas-permeable cover, wherein the sensor chip and the gas-permeable cover mechanically contact the elastic layer and the elasticity of the elastic layer is greater than the elasticity of the sensor chip.

Example 18 is a sensor device according to one of the preceding examples, wherein the sensor chip is designed to detect pressure signals.

Example 19 is a method for producing sensor devices, the method comprising: generating a semiconductor wafer having a plurality of sensor chips, wherein each sensor chip comprises a MEMS structure arranged at a main surface of the semiconductor wafer; forming a plurality of gas-permeable covers over the main surface of the semiconductor wafer, wherein each gas-permeable cover covers one of the MEMS structures and forms a cavity above the MEMS structure; and singulating the semiconductor wafer into a plurality of sensor devices.

Example 20 is a method according to example 19, wherein the process of forming the plurality of gas-permeable covers and cavities comprises: generating a wafer with a plurality of recesses, wherein the wafer is manufactured from at least one of a semiconductor material, a glass material or a ceramic material; and wafer bonding the wafer to the semiconductor wafer, wherein the recesses are arranged above the MEMS structures and form the cavities.

Example 21 is a method according to example 19, wherein the process of forming the plurality of gas-permeable covers and cavities comprises: forming a plurality of sacrificial layers over the MEMS structures; forming a plurality of material layers over the plurality of sacrificial layers; structuring the material layers to form the gas-permeable covers; and removing the sacrificial layers to form the cavities.

Example 22 is a method according to example 21, wherein the structuring of the material layers comprises a photolithographic process.

Example 23 is a method according to example 19, wherein the process of forming the plurality of gas-permeable covers and cavities comprises: forming a plurality of sacrificial layers over the MEMS structures; forming a rewiring layer over the plurality of sacrificial layers to form the gas-permeable covers; and removing the sacrificial layers to form the cavities.

Although specific embodiments have been illustrated and described herein, it is obvious to the person skilled in the art that a plurality of alternative and/or equivalent implementations can replace the specific embodiments shown and described, without departing from the scope of the present disclosure. This application is intended to include all modifications or variations of the specific embodiments discussed herein. It is therefore intended that this disclosure is limited only by the claims and their equivalents.

What is claimed is:

1. A sensor device, comprising:
a sensor chip comprising a semiconductor material having a main surface, and a micro-electromechanical systems (MEMS) structure integrated in the semiconductor material at the main surface of the semiconductor material, wherein the MEMS structure resides within the semiconductor material of the sensor chip,
wherein the semiconductor material comprises one or more trenches that extend from the main surface of the semiconductor material into the semiconductor material,
wherein the one or more trenches laterally surround the MEMS structure within the semiconductor material; and
a gas-permeable cover which is arranged over the main surface of the semiconductor material and covers the MEMS structure, thereby forming a cavity above the MEMS structure, between the MEMS structure and the gas-permeable cover.

2. The sensor device as claimed in claim 1, wherein the gas-permeable cover has a plurality of openings and a maximum dimension of each opening is less than 5 microns.

3. The sensor device as claimed in claim 1, wherein the gas-permeable cover is manufactured from at least one of a photoresist, a polyimide, or a polybenzoxazole.

4. The sensor device as claimed in claim 1, wherein the gas-permeable cover is manufactured from at least one of a further semiconductor material, a glass material, or a ceramic material.

5. The sensor device as claimed in claim 1, wherein:
the one or more trenches include a plurality of trenches, each trench of the plurality of trenches extending from the main surface of the semiconductor material into the semiconductor material and laterally surrounding the MEMS structure in a plan view of the main surface of the semiconductor material.

6. The sensor device as claimed in claim 5, wherein, in a plan view of the main surface of the semiconductor material, the plurality of trenches are arranged laterally outside of an outline of the gas-permeable cover such that the plurality of trenches and the gas-permeable cover do not overlap in a vertical dimension.

7. The sensor device as claimed in claim 5, wherein, in a plan view of the main surface of the semiconductor material, the plurality of trenches are arranged within an outline of the gas-permeable cover, such that the plurality of trenches are covered by the gas-permeable cover in a vertical dimension.

8. The sensor device as claimed in claim 1, further comprising:
a rewiring layer that electrically couples electrical contacts of the sensor chip with peripheral connecting elements of the sensor device,
wherein the rewiring layer is arranged over the main surface of the semiconductor material, over a second main surface of the sensor chip that is arranged opposite to the main surface of the semiconductor material, or over a main surface of the gas-permeable cover.

9. The sensor device as claimed in claim 8, wherein the gas-permeable cover is manufactured from a part of the rewiring layer.

10. The sensor device as claimed in claim 1, further comprising:
an electrical via passing through the sensor chip and which electrically couples electrical contacts of the sensor chip with peripheral connecting elements of the sensor device.

11. The sensor device as claimed in claim 1, further comprising:
an electrical via passing through the gas-permeable cover and which electrically couples electrical contacts of the sensor chip with peripheral connecting elements of the sensor device.

12. The sensor device as claimed in claim 1, further comprising:
an encapsulation material arranged over the main surface of the semiconductor material, wherein the gas-permeable cover is at least partially embedded in the encapsulation material.

13. The sensor device as claimed in claim 12, further comprising:
an electrical via passing through the encapsulation material and which electrically couples electrical contacts of the sensor chip with peripheral connecting elements of the sensor device.

14. The sensor device as claimed in claim 1, wherein the gas-permeable cover is mechanically connected to the semiconductor material of the sensor chip.

15. The sensor device as claimed in claim 1, further comprising a passivation layer arranged on the main surface of the semiconductor material,
wherein the passivation layer comprises an opening arranged over the MEMS structure to expose the MEMS structure to the cavity,
wherein the gas-permeable cover is mechanically connected to an upper main surface of the passivation layer and the gas-permeable cover is arranged over the opening to cover the MEMS structure, and
wherein the opening forms at least part of the cavity.

16. The sensor device as claimed in claim 1, further comprising:
an elastic layer arranged between the main surface of the semiconductor material and the gas-permeable cover, wherein the semiconductor material and the gas-permeable cover mechanically contact the elastic layer, wherein an elasticity of the elastic layer is greater than an elasticity of the sensor chip.

17. The sensor device as claimed in claim 1, wherein the MEMS structure includes a membrane arranged at the main surface of the semiconductor material.

18. The sensor device as claimed in claim 15, wherein the one or more trenches extend through the passivation layer.

19. The sensor device as claimed in claim 15, further comprising:
an encapsulation material arranged on the upper main surface of the passivation layer, wherein the gas-permeable cover is at least partially embedded in the encapsulation material.

20. The sensor device as claimed in claim 16, wherein the one or more trenches extend through the elastic layer.

21. The sensor device as claimed in claim 16, wherein the elastic layer comprises an opening arranged over the MEMS structure to expose the MEMS structure to the cavity,
wherein the gas-permeable cover is arranged over the opening to cover the MEMS structure, and
wherein the opening forms at least part of the cavity.

22. The sensor device as claimed in claim 1, further comprising:
an elastic layer arranged on the main surface of the semiconductor material, between the main surface of the semiconductor material and the gas-permeable cover, wherein an elasticity of the elastic layer is greater than an elasticity of the sensor chip, wherein the elastic layer comprises a first opening formed over the MEMS structure to expose the MEMS structure to the cavity; and a passivation layer arranged on the elastic layer, between the elastic layer and the gas-permeable cover, wherein the passivation layer comprises a second opening formed over the MEMS structure to expose the MEMS structure to the cavity, wherein the gas-permeable cover is arranged over the first opening and the second opening to cover the MEMS structure, and wherein the first opening and the second opening form at least part of the cavity.

23. The sensor device as claimed in claim 22, wherein the elastic layer is in contact with the main surface of the semiconductor material, and wherein the gas-permeable cover is mechanically connected to the passivation layer.

\* \* \* \* \*